(12) United States Patent
Chu et al.

(10) Patent No.: US 7,918,025 B2
(45) Date of Patent: Apr. 5, 2011

(54) METHOD OF FABRICATING A THERMAL SPREADER HAVING THERMAL CONDUITS

(75) Inventors: Richard C. Chu, Poughkeepsie, NY (US); Michael J. Ellsworth, Jr., LaGrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 12/252,386

(22) Filed: Oct. 16, 2008

(65) Prior Publication Data

US 2009/0038153 A1    Feb. 12, 2009

Related U.S. Application Data

(62) Division of application No. 10/953,991, filed on Sep. 29, 2004, now Pat. No. 7,459,112, which is a division of application No. 09/965,489, filed on Sep. 27, 2001, now Pat. No. 6,821,625.

(51) Int. Cl.
*B23P 15/26* (2006.01)

(52) U.S. Cl. .......... 29/890.04; 29/890.03; 264/158; 264/160; 264/261; 264/275

(58) Field of Classification Search .......... 29/890.03, 29/890.04; 264/275, 158, 160, 261; 165/185
See application file for complete search history.

(56) References Cited

U.S. PATENT DOCUMENTS

| | | | |
|---|---|---|---|
| 3,322,868 A * | 5/1967 | Rossello et al. | 264/46.5 |
| 3,577,496 A | 5/1971 | Hoffman | |
| 5,371,654 A | 12/1994 | Beaman et al. | |
| 5,402,004 A | 3/1995 | Ozmat | |
| 5,499,450 A * | 3/1996 | Jacoby | 29/890.03 |
| 5,531,022 A | 7/1996 | Beaman et al. | |
| 5,623,394 A | 4/1997 | Sherif et al. | |
| 5,660,917 A | 8/1997 | Fujimori et al. | |
| 5,673,177 A * | 9/1997 | Brodsky et al. | 361/704 |
| 5,694,515 A | 12/1997 | Goswami et al. | |
| 5,944,097 A | 8/1999 | Gungor et al. | |
| 5,989,470 A | 11/1999 | Doan et al. | |
| 5,997,999 A | 12/1999 | Horiuchi et al. | |
| 6,151,216 A | 11/2000 | Vos et al. | |
| 6,165,612 A | 12/2000 | Misra | |
| 6,183,272 B1 | 2/2001 | Muller et al. | |
| 6,188,582 B1 | 2/2001 | Peter | |
| 6,403,201 B1 | 6/2002 | Otagiri et al. | |
| 6,407,922 B1 | 6/2002 | Eckblad et al. | |
| 6,424,533 B1 | 7/2002 | Chu et al. | |
| 6,566,748 B1 | 5/2003 | Shimizu et al. | |

* cited by examiner

*Primary Examiner* — David P Bryant
*Assistant Examiner* — Ryan J Walters
(74) *Attorney, Agent, or Firm* — Cantor Colburn LLP; Dennis Jung

(57) ABSTRACT

A thermal spreading device disposable between electronic circuitry and a heat sink includes a substrate having parallel first and second faces and conduits extending through the substrate between the faces. The substrate material has a first thermal conductivity value in a direction parallel to the faces and a second thermal conductivity value in a direction normal to the faces, with the second thermal conductivity value being less than the first thermal conductivity value. The conduit material has a thermal conductivity value associated with it, with the thermal conductivity value being greater than the second thermal conductivity value of the substrate. One method of fabricating the thermal spreading device includes disposing a molding material radially about the rods and hardening the material. Other methods include press fitting and shrink fitting the rods into a substrate material.

3 Claims, 11 Drawing Sheets

METHOD OF FABRICATING A THERMAL SPREADER HAVING THERMAL CONDUITS

CROSS-REFERENCE TO RELATED APPLICATIONS

This application is a divisional of application Ser. No. 10/953,991 filed Sep. 29, 2004, now U.S. Pat. No. 7,459,112, which is a divisional of application Ser. No. 09/965,489, filed Sep. 27, 2001, now U.S. Pat. No. 6,821,625, the contents of which are incorporated by reference herein in their entirety.

BACKGROUND

In nearly every sector of the electronics industry, electronic circuitry involves the interconnection of an integrated chip (hereinafter "chip") and a surface or device upon which the chip is supported. During operation of the circuitry, heat is generated and a heat flux is established between the chip and its environment. In order to remove heat more effectively to ensure the proper functioning of the circuitry, the heat flux is disseminated across a surface area larger than the surface area of the chip and transferred to an attached heat sink device. Once the heat is transferred to the heat sink device, it can be removed by a forced convection of air or other cooling means.

In some applications, multiple processors and their associated control and support circuitry are arranged on a single chip. Such arrangements may result not only in a further increase in the heat flux, but also in a non-uniform distribution of the heat flux across the surface of the chip. The non-uniformity of the distribution of the heat flux is generally such that a higher heat flux is realized in the processor core region and a significantly lower heat flux is realized in the region of the chip at which the control and support circuitry is disposed. The high heat flux in the processor core region may cause devices in this region to exceed their allowable operating temperatures. The resulting disparity in temperature between the two regions, which may be significant, may contribute to the stressing and fatigue of the chip.

A thermally conductive heat spreading device is oftentimes disposed between the chip and the heat sink device to facilitate the dissemination of heat from the chip. Such heat spreading devices are generally plate-like in structure and homogenous in composition and fabricated from materials such as copper, aluminum nitride, or silicon carbide. Newer carbon fiber composites exhibit even higher thermal conductivities than these traditional thermal spreader materials; however, they tend to be anisotropic in nature, exhibiting wide variations in thermal conductivity between a major axis normal to the face of the structure (in the Z direction) and the axes orthogonal to the major axis (in the X and Y directions). Moreover, the lower thermal conductivity in the direction along the major axis tends to have the effect of increasing the thermal resistance of the heat spreading device, thereby inhibiting the dissemination of heat from the device.

SUMMARY

A thermal spreading device disposable between electronic circuitry and a heat sink is disclosed. The device includes a substrate having a first face and a second face and a plurality of conduits extending through the substrate from the first face to the second face. The two faces of the substrate are disposed in a parallel relationship. The material of which the substrate is fabricated has a first thermal conductivity value in a direction parallel to the faces and a second thermal conductivity value in a direction normal to the faces, with the second thermal conductivity value being less than the first thermal conductivity value. The material of which each conduit is fabricated has a thermal conductivity value associated with it, with the thermal conductivity value of each conduit being greater than the second thermal conductivity value of the substrate.

One method of fabricating the thermal spreading device includes arranging a plurality of thermally conductive rods such that the rods extend longitudinally in a common direction, disposing a molding material radially about the longitudinally extending rods, hardening the molding material around the plurality of thermally conductive rods, and cutting the hardened molding material into slices in a direction perpendicular to the direction in which the rods longitudinally extend. Other methods of fabrication include press fitting or shrink fitting the thermally conductive rods into holes in the substrate.

BRIEF DESCRIPTION OF THE DRAWINGS

The present disclosure will be better understood by those skilled in the pertinent art by referencing the accompanying drawings, where like elements are numbered alike in the several FIGURES, in which.

DETAILED DESCRIPTION

Figure 1:
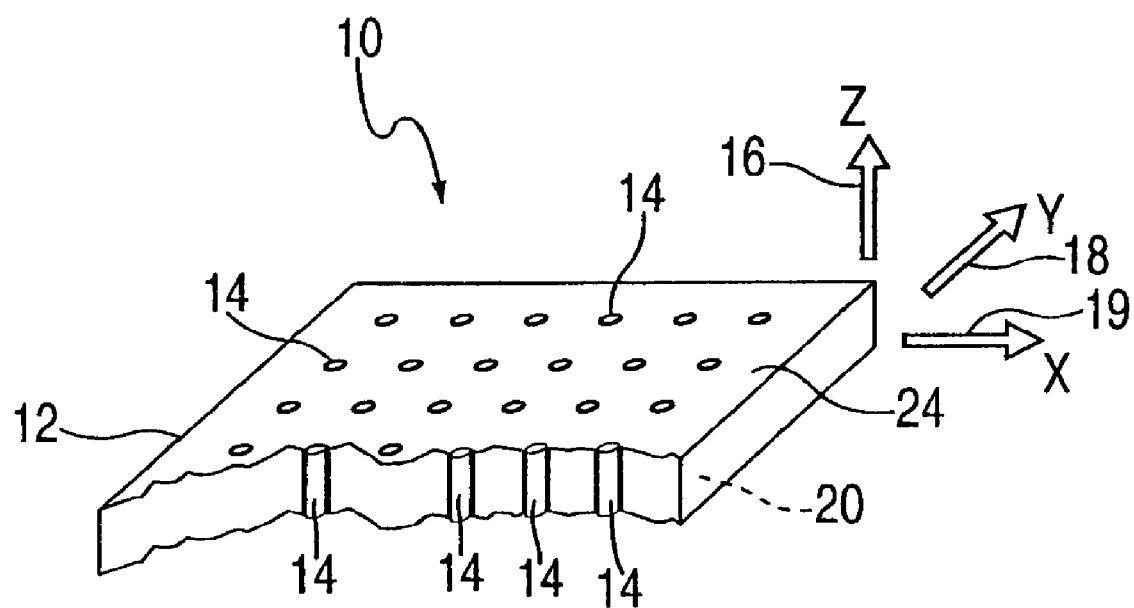
FIG. 1 is a perspective cutaway view of a thermal spreading device.

Referring now to FIG. 1, an exemplary embodiment of a thermal spreading device is shown generally at 10 and is hereinafter referred to as "thermal spreader 10." Thermal spreader 10 is a conduction medium that provides for thermal communication between electronic circuitry (e.g., a chip) and an environment to which thermal spreader 10 is exposed. The thermal communication is effectuated by the conduction of heat across a substrate 12 to a heat sink (shown with reference to FIG. 5). Because the materials from which substrate 12 are fabricated are generally of an anisotropic nature, substrate 12 is oftentimes characterized by a marked disparity in thermal conductivities in orthogonal directions. In particular, the thermal conductivity of substrate 12 in a direction shown by an arrow 16 (Z direction), which is normal to the interface of thermal spreader 10 and the circuitry (not shown), may be substantially less than thermal conductivities in the directions shown by an arrow 18 (X direction) and an arrow 19 (Y direction) along the same interface of thermal spreader 10 and the circuitry. Due to such disparities, the thermal resistance across substrate 12 (in the direction of arrow 16) is increased, and the rate of heat transfer (flux) across thermal spreader 10 varies dramatically from the flux in the direction (as shown by arrows 18 and 19) that the interface extends.

In order to enhance the thermal communication across thermal spreader 10, substrate 12 is configured to include thermal conduits 14. The materials from which thermal conduits 14 are fabricated generally have thermal conductivity values that are substantially higher than the thermal conductivity values in the Z direction of the material from which substrate 12 is fabricated. Because the flux through conduits 14 is greater than the flux in the same direction across the surrounding substrate 12, heat conduction is enhanced across substrate 12 in the direction shown by arrow 16 (Z direction), viz., in the direction in which conduits 14 extend. Heat transfer is thereby optimized through substrate 12 via conduits 14.

Conduits 14 are defined by rods or wires having substantially circular cross sectional geometries, as is shown. Rods or wires having substantially circular cross sectional geometries enable a substantially uniform transfer of heat to be maintained in the directions radial to the circular cross section. Other cross sectional geometries that may be used include, but are not limited to, elliptical, square, flat, multi-faced, and configurations incorporating combinations of the foregoing geometries. Regardless of the cross sectional geometry, conduits 14 are formed from materials having high thermal conductivities. Such materials include, but are not limited to, copper, aluminum, carbon, carbon composites, and similar materials that exhibit a high thermal conductivity along the conduit axis. The carbon materials may be fibrous or particulate in structure.

Substrate 12 provides an anchor into which conduits 14 are disposed while further providing a medium for the transfer of heat in directions along and parallel to the interface defined by the positioning of thermal spreader 10 on the chip. Exemplary materials from which substrate 12 can be fabricated include, but are not limited to, carbon and carbon composites. As noted above with respect to conduits 14, the carbon materials may be fibrous or particulate in structure.

The configuration of thermal spreader 10 is generally such that conduits 14 are arranged to be parallel to each other, as is shown in FIG. 1. Furthermore, conduits 14 generally extend linearly between opposing surfaces of substrate 12. As shown, the architecture of thermal spreader 10 is further defined by a substantially uniform spatial positioning of conduits 14 over any randomly selected section of substrate 12. The even distribution of conduits 14 facilitates and improves the conduction of heat from a first face 20 disposed adjacent the chip and an opposingly-positioned second face 24 disposed adjacent the heat sink. Such a distribution provides for the effective transfer of heat longitudinally through conduits 14 while maintaining the substantially uniform transfer of the heat in the directions radial to the surfaces of conduits 14.

When thermal spreader 10 is mounted between a chip (shown with reference to FIG. 5) and a heat sink (also shown with reference to FIG. 5), conduits 14 enable heat generated during the operation of the chip to be communicated from first face 20 of thermal spreader 10 through conduits 14 across substrate 12 to second face 24 of thermal spreader 10. Although the material of which substrate 12 is fabricated allows for some degree of thermal conduction between faces 20, 24, the anisotropic nature of the material causes heat generated by the chip and transferred to thermal spreader 10 to be more substantially dissipated through substrate 12 in the directions shown by arrows 18 and 19. Dissipation of heat in the directions shown by arrows 18 and 19 allows for the heat to be conducted to a larger number of conduits 14, which further allows for the more effective transfer of heat from the chip to the heat sink.

Figure 2A:
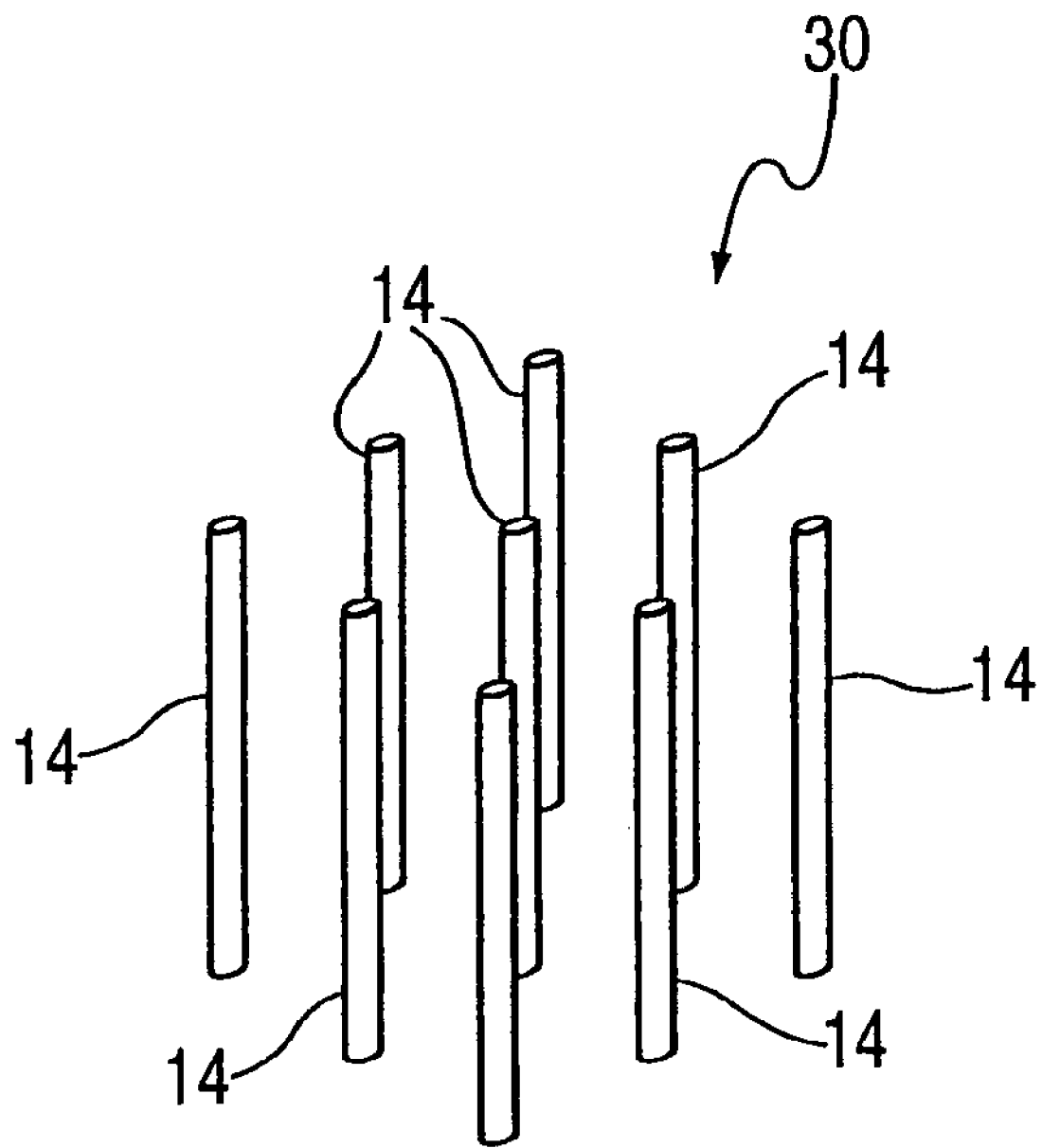
FIGS. 2A through 2C are perspective views of a batch process of the fabrication of a thermal spreading device.
Figure 2B:
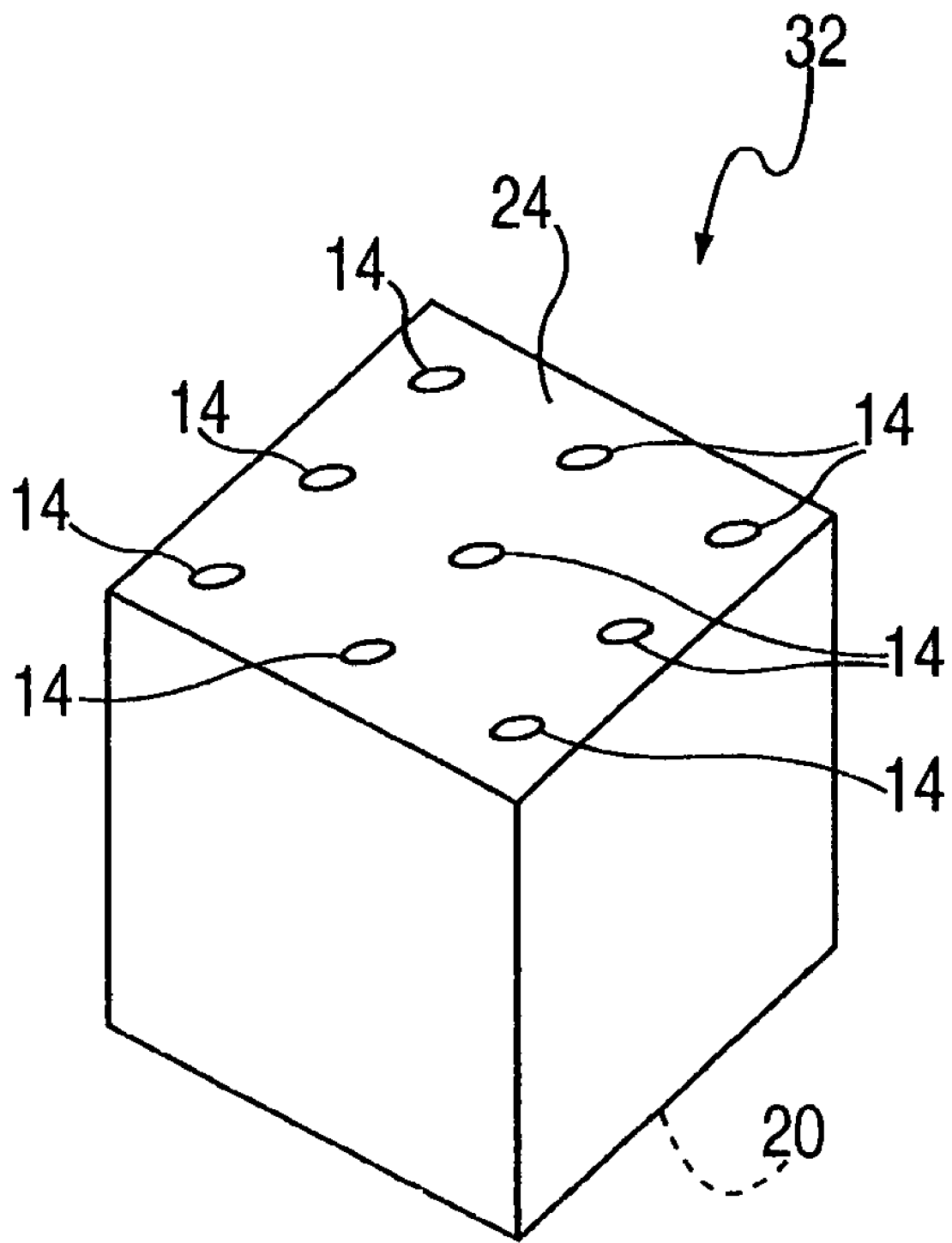
Figure 2C:
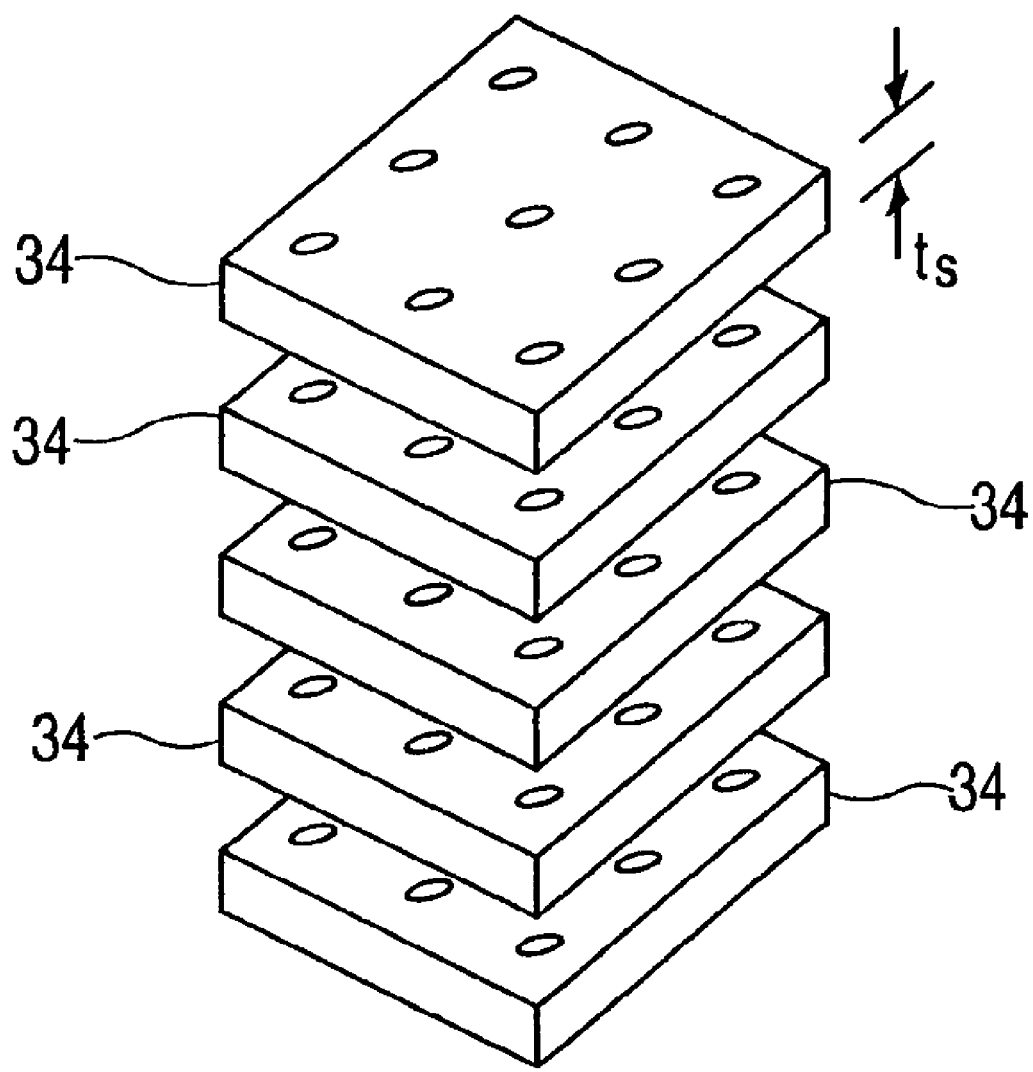

Referring now to FIGS. 2A through 2C, an exemplary batch process illustrating the fabrication of the thermal spreader is illustrated. The process comprises arranging the rods or wires by which conduits 14 are defined into an array, which is shown generally at 30 in FIG. 2A. The rods are arranged such that the longitudinal axes of the rods are parallel to each other and held fast by a jig (not shown) or other device configured to maintain the rods in their proper alignment. Molding material of which the substrate is formed is then disposed around the rods, hardened, and cured, as is shown in FIG. 2B. The hardened and cured molding material forms a block, shown generally at 32, having thermal conduits 14 extending between first face 20 and opposing second face 24 thereof. Block 32 is then sawed or otherwise made into sheets 34, as is illustrated in FIG. 2C. Each sheet 34 is of a thickness $t_s$, which is slightly in excess of the desired thickness of the finished thermal dissipating device. Sheets 34 are then polished on at least one face thereof to bring thicknesses $t_s$ within the allowable tolerances of final product. Polishing of the sheets on both sides further provides sheets 34 with surface textures conducive to a more effective transfer of heat between the chip and the heat sink. Finally, sheets 34 are cut into individual thermal spreaders 10 of the desired length and width.

Figure 3A:
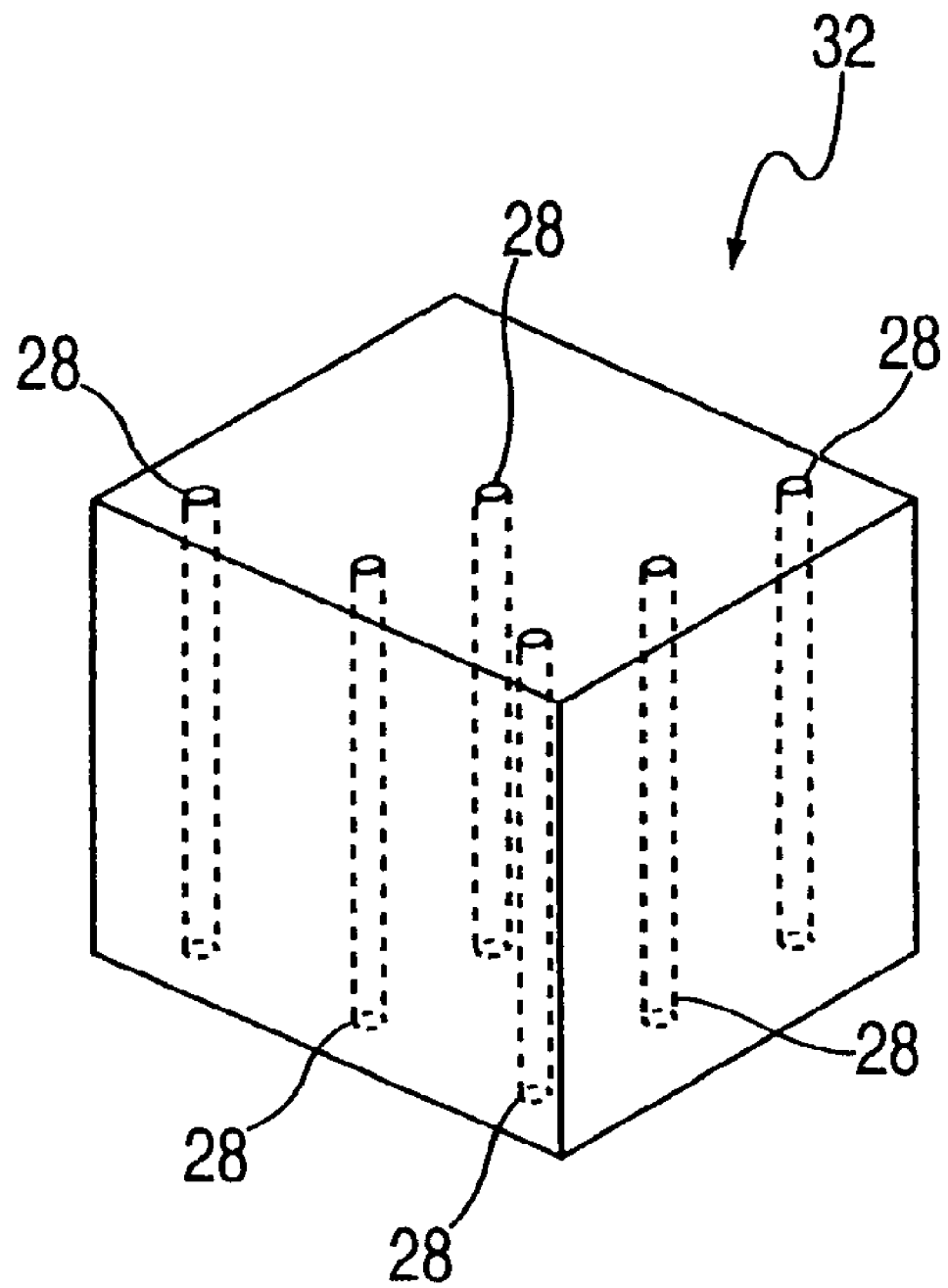
FIGS. 3A and 3B are perspective views of a batch process of the fabrication of a thermal spreading device in which conduits are press fitted into the substrate.
Figure 3B:
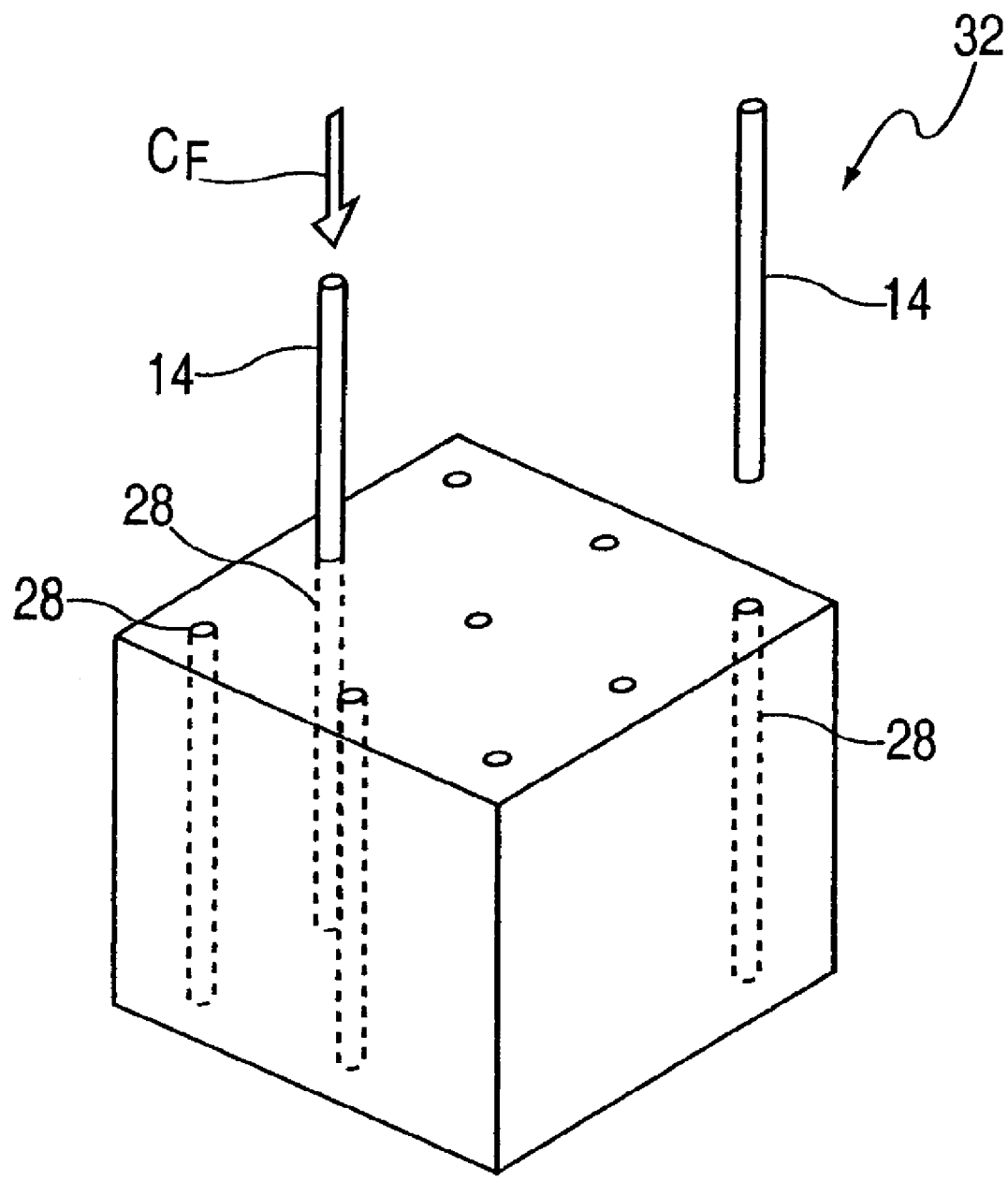

In another exemplary process of the fabrication of the thermal spreader, thermal conduits 14 may be press-fitted into substrate 12, as is shown in FIGS. 3A and 3B. Referring to FIG. 3A, holes 28 are drilled, punched, or otherwise formed in block 32. The cross sectional geometries of holes 28 correspond with the cross sectional geometries of conduits 14 insertable into holes 28. Referring now to FIG. 3B, conduits 14 are inserted into holes 28 under a compressive force $C_f$ effectuated by a press (not shown) or a similar apparatus. The mechanical tolerances of conduits 14 are such that when conduits 14 are received in holes 28, a tight fit is maintained between the inner surfaces of holes 28 and the outer surfaces of each conduit 14, thereby allowing effective thermal communication to be maintained between the material of block 32 and conduits 14. Block 32 may then be sawed or otherwise formed into sheets and polished and cut to the desired lengths and widths.

Figure 4:
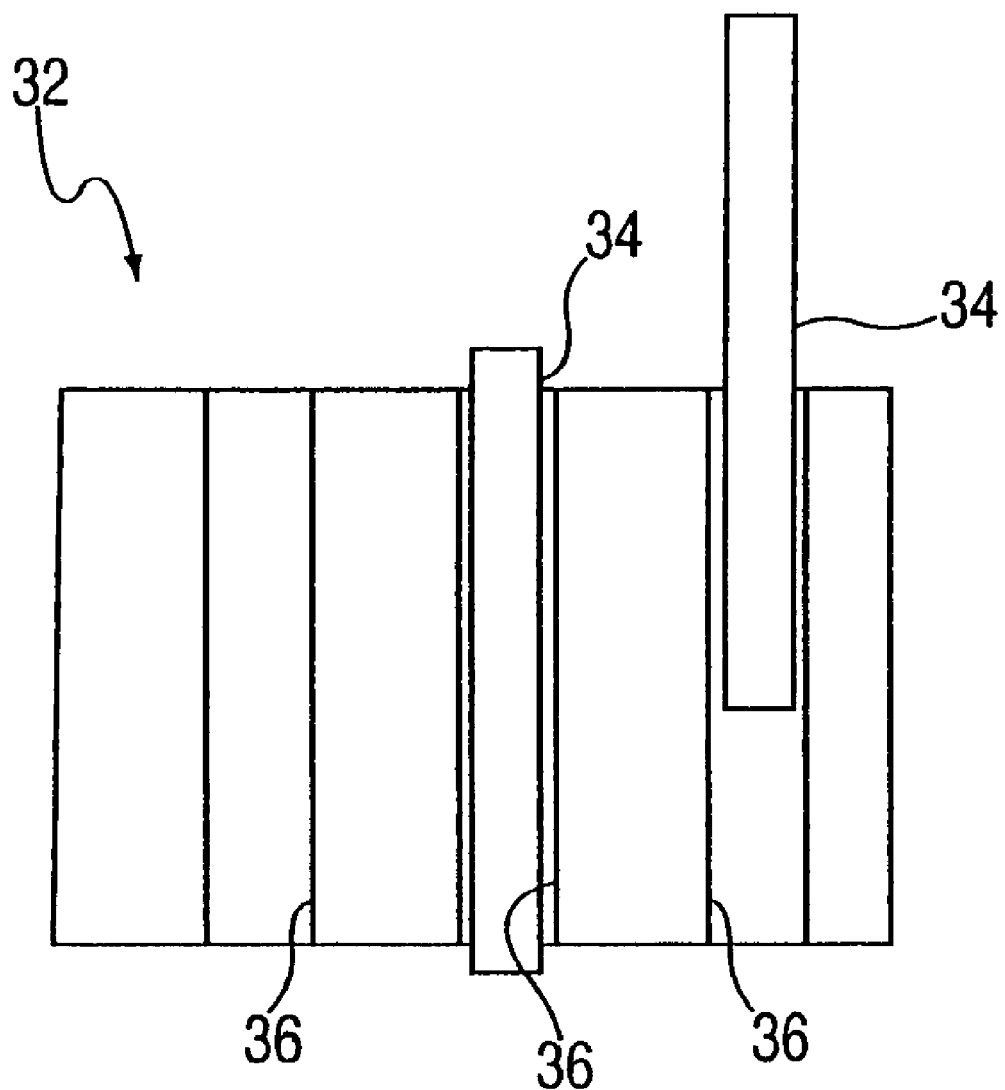
FIG. 4 is a sectional view of a step in a batch process of the fabrication of a thermal spreading device in which conduits are shrink fitted into the substrate.

In yet another exemplary process of the fabrication of the thermal spreader, thermal conduits 14 may be shrink-fitted into substrate 12, as is shown in FIG. 4. In the shrink-fitting process, holes 28 are again drilled, punched, or otherwise formed in block 32, as was described above. Block 32 is heated to a temperature that causes block 32 (and subsequently holes 28) to expand. Upon expansion, conduits 14 are inserted into holes 28 with little effort such that space is defined by inner surfaces 34 of holes and outer surfaces 36 of conduits 14. Block 32 is then cooled to cause the material of fabrication of block 32 to contract, thereby constricting holes 28 and eliminating the spaces defined between the inner surfaces of holes 28 and the outer surfaces of conduits 14. Once constricted, conduits 14 are securely retained within block 28. Block 32 may then be sawed or otherwise formed into sheets and polished and cut to the desired dimensions in manners similar to those described above to form the final product.

Figure 5:
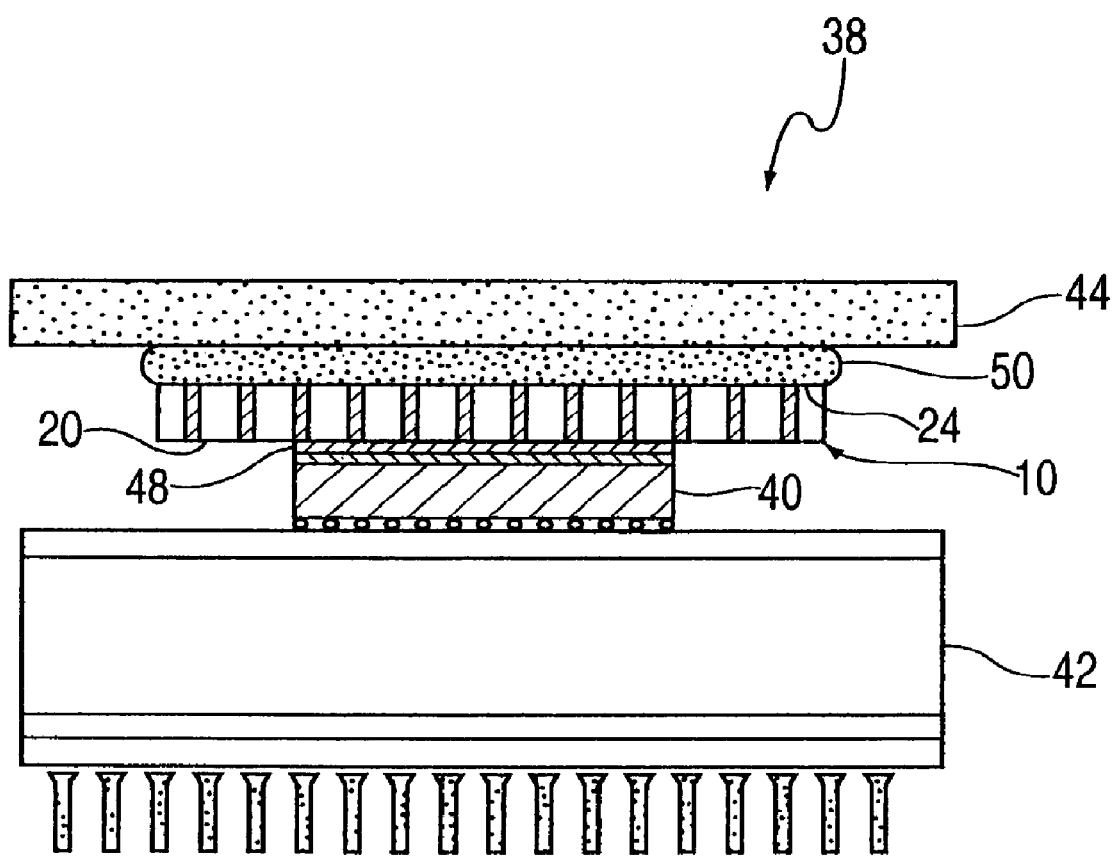
FIG. 5 is a sectional view of the engagement of a thermal spreading device with a chip and a heat sink.

Referring now to FIG. 5, a thermal conduction package is shown generally at 38. In thermal conduction package 38, thermal spreader 10 is shown as it would be disposed between the chip 40 disposed in electronic communication with its associated circuitry through substrate 42 and the heat sink 44. Thermal spreader 10 is adhered to chip 40 with an adhesive 48, which may be a solder or an epoxy material applied to chip 40 as a thin layer upon which thermal spreader 10 is placed. A layer of thermal paste 50, which is typically a natural or synthetic oil-based compound with thermally conductive particle filler, is applied to the exposed surface of thermal spreader 10 upon which heat sink 44 is mounted. Both adhesive 48 and thermal paste 50 facilitate the transfer of heat between chip 40 and thermal spreader 10 and thermal spreader 10 and heat sink 44 respectively, thereby enhancing the conduction of heat across thermal spreader 10.

Figure 6:
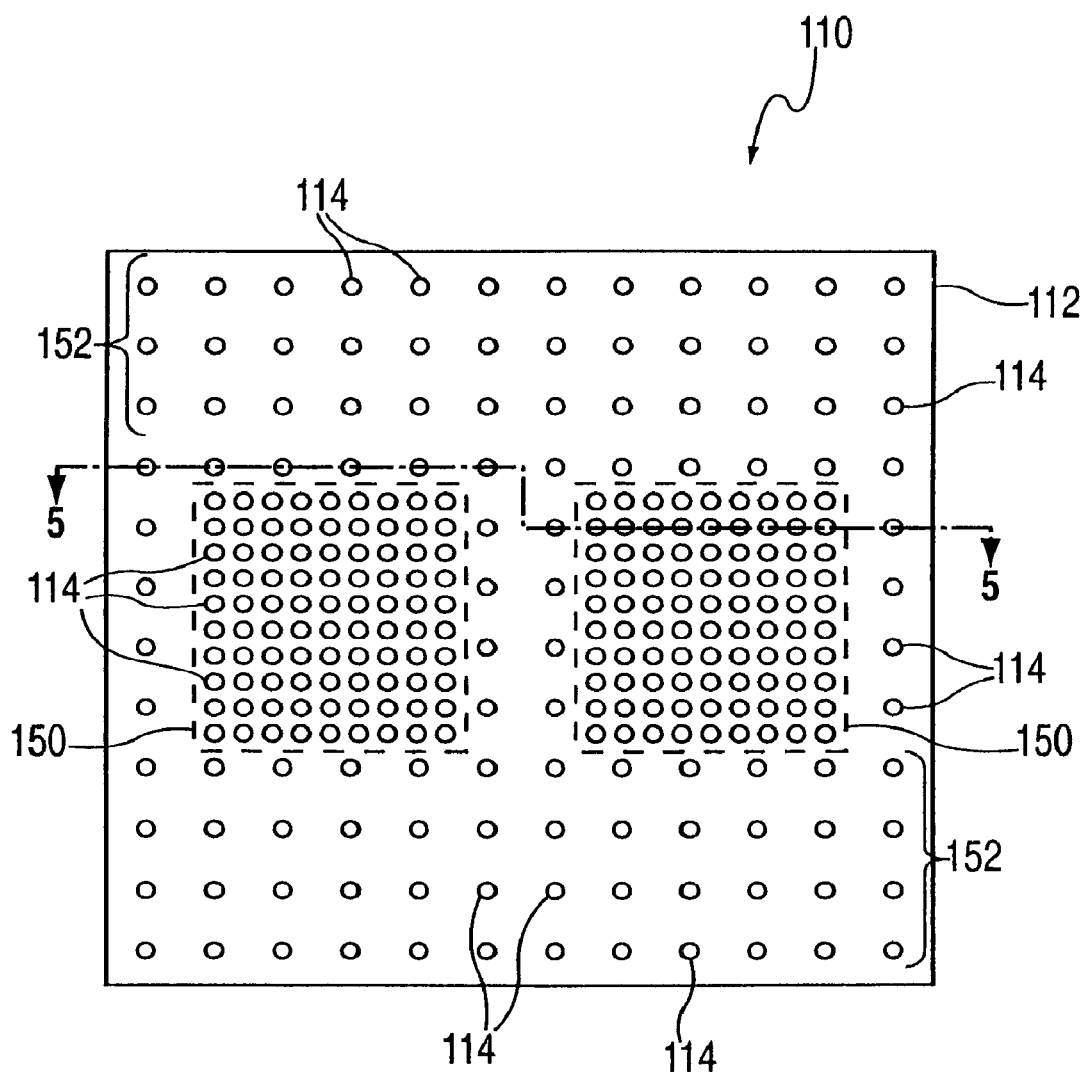
FIGS. 6 and 7 are plan and cross sectional views of an alternate exemplary embodiment of a thermal spreading device.
Figure 7:
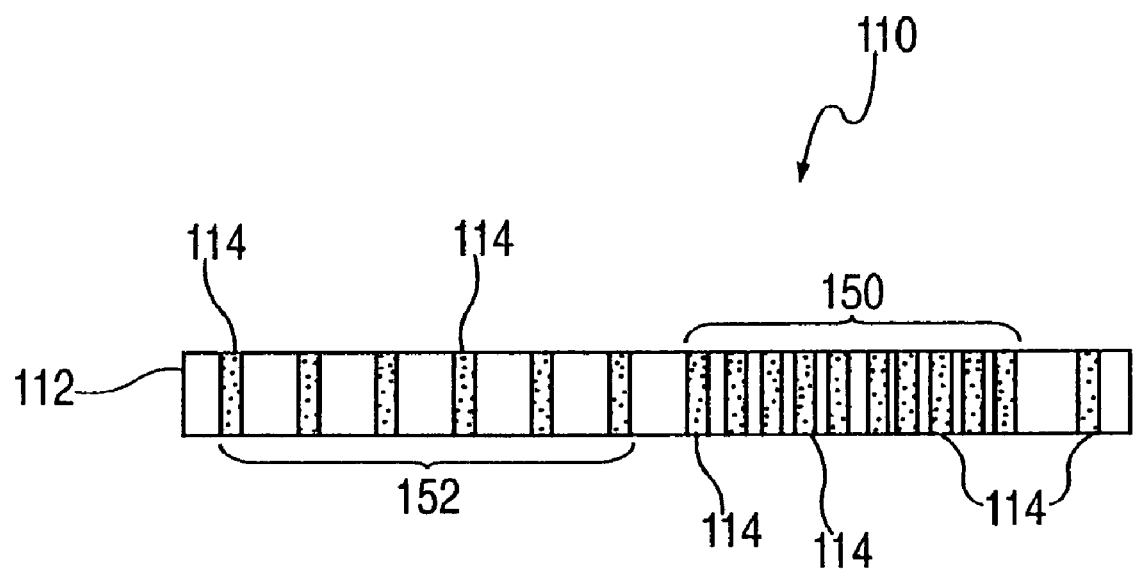

As is shown with reference to FIGS. 6 and 7, another exemplary embodiment of a thermal dissipating device is shown generally at 110. Thermal spreader 110 is substantially similar to thermal spreader 10 as illustrated above with reference to FIGS. 1 through 5. Thermal spreader 110, however, includes an arrangement of variably spaced conduits 114 disposed within a dissipating substrate 112. The arrangement of variably spaced conduits 114 is configured to define regions 150 in which the density of conduits 114 is greater than the density of conduits 114 in adjacently positioned regions 152 of the same substrate 112. The high-density regions 150 are positioned on substrate 112 to register with areas of high heat flux on a chip upon assembly of the thermal conduction package.

Figure 8:
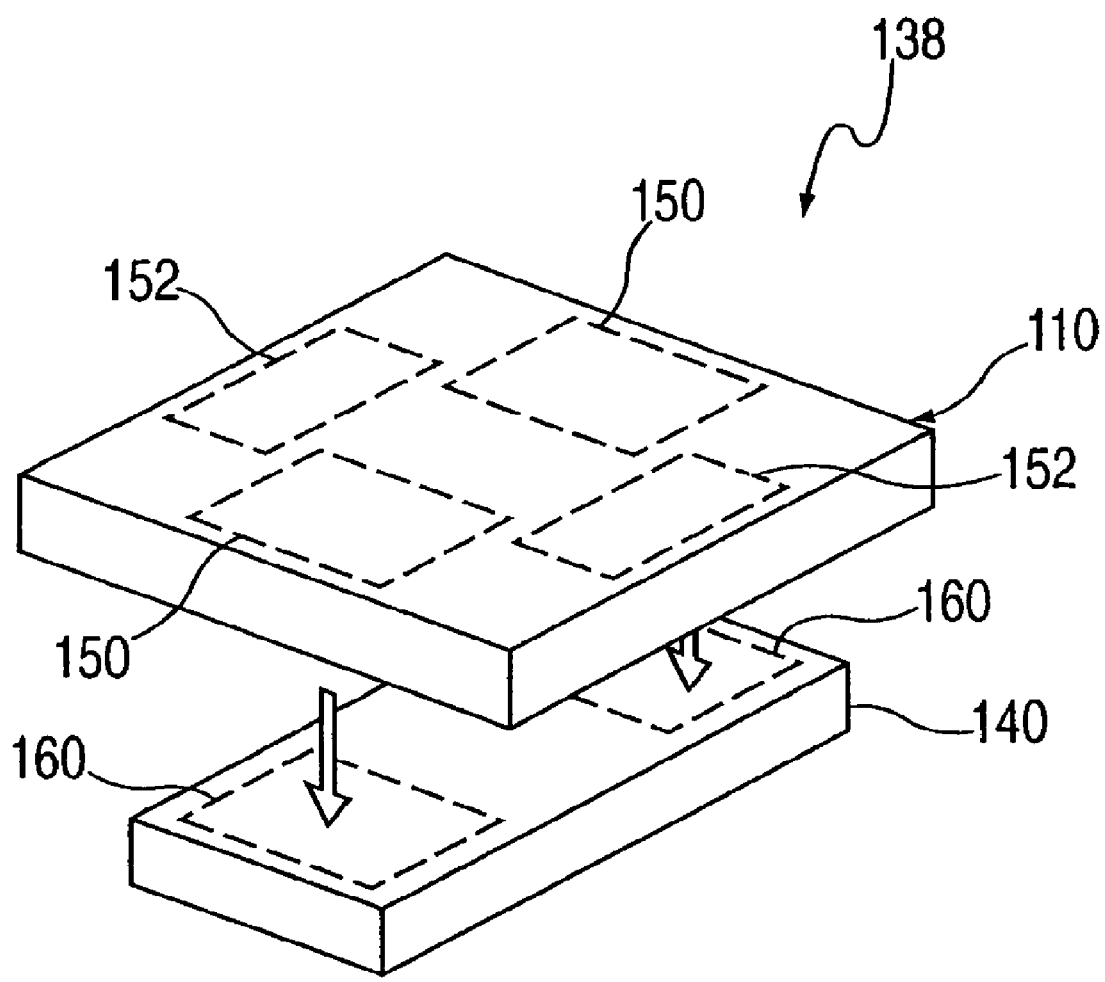
FIG. 8 is an exploded perspective view of the engagement of the thermal spreading device of FIGS. 6 and 7 with a chip.

Referring now to FIG. 8, the engagement of the thermal spreader with the chip is illustrated generally at 138. When thermal spreader 110 is placed in communication with chip 140, the high-density regions 150 register with the areas of high flux 160 on chip 140. Such a placement allows for the increased transfer of heat from the areas of high flux 160 on chip 140 to high-density regions 150 of thermal spreader 110 while simultaneously providing a thermally adequate transfer of heat from the areas of chip 140 from which lower heat flux is realized. The disparities in the densities of the conduits in each region 150, 152 are engineered to provide for the removal of heat from each portion of chip 140 and the transfer of heat to the heat sink to minimize disparity in heat build up at the interface of chip 140 and thermal spreader 110. Minimization of such disparity may provide improved operability of chip 140 and increase the useful life thereof. Fabrication of thermal spreader 110 is effectuated in a batch process substantially similar to that illustrated in FIGS. 2A through 4 for thermal spreader 10.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A method of fabricating a thermal spreading device, the method comprising:

forming holes into a substrate in a manner such that a density of an arrangement of the holes is variable over a cross sectional area of the arrangement;

wherein the arrangement is configured to form at least one higher density region position to register with at least one higher heat flux area of a chip upon assembly of the thermal spreading device to the chip to form an interface surface of the thermal spreading device and the chip;

wherein the arrangement is configured to form at least one lower density region positioned to register with at least one lower heat flux area of the chip upon assembly of the thermal spreading device to the chip;

wherein the at least one higher density region has a higher density than the lower density region and the higher heat flux area has a higher heat flux than the at least one lower heat flux area;

wherein the at least one higher density region and the at least one lower density region are positioned so as to minimize a disparity in heat buildup at the interface surface between the higher heat flux area and the lower heat flux area; and inserting a thermally conductive rod into each of the holes formed in the substrate, said inserting being effectuated under a compressive force.

2. The method of claim 1, further comprising cutting the substrate into slices in a direction perpendicular to the direction in which the rods extend.

3. The method of claim 2, further comprising polishing a face of the cut slice of the substrate.

* * * * *